United States Patent [19]

Fletcher et al.

[11] 3,996,462
[45] Dec. 7, 1976

[54] SOLID-STATE CURRENT TRANSFORMER

[76] Inventors: James C. Fletcher, Administrator of the National Aeronautics and Space Administration, with respect to an invention of David L. Farnsworth, Severna Park, Md.

[22] Filed: June 23, 1975

[21] Appl. No.: 589,233

[52] U.S. Cl. .............................. 250/214 A; 330/14; 330/28; 330/59
[51] Int. Cl.² ........................................ H01J 39/12
[58] Field of Search .............. 330/28, 14, 30 D, 59; 250/211 J, 214 A

[56] References Cited
UNITED STATES PATENTS

| | | | |
|---|---|---|---|
| 3,383,612 | 5/1968 | Harwood | 330/30 D |
| 3,697,882 | 10/1972 | Plassche | 330/14 X |
| 3,717,821 | 2/1973 | Amemiya et al. | 330/30 D X |
| 3,801,820 | 4/1974 | Eichelberger et al. | 250/211 J |
| 3,840,819 | 10/1974 | Steckler | 330/30 D |

Primary Examiner—James B. Mullins
Attorney, Agent, or Firm—L. D. Wofford, Jr.; G. J. Porter; J. R. Manning

[57] ABSTRACT

A signal transformation network which is uniquely characterized to exhibit a very low input impedance while maintaining a linear transfer characteristic when driven from a voltage source and when quiescently biased in the low microampere current range. In its simplest form, it consists of a tightly coupled two-transistor network in which a common emitter input stage is interconnected directly with an emitter follower stage to provide virtually 100 percent negative feedback to the base input of the common emitter stage. Bias to the network is supplied via the common tie point of the common emitter stage collector terminal and the emitter follower base stage terminal by a regulated constant current source, and the output of the circuit is taken from the collector of the emitter follower stage.

1 Claim, 3 Drawing Figures

U.S. Patent  Dec. 7, 1976  3,996,462
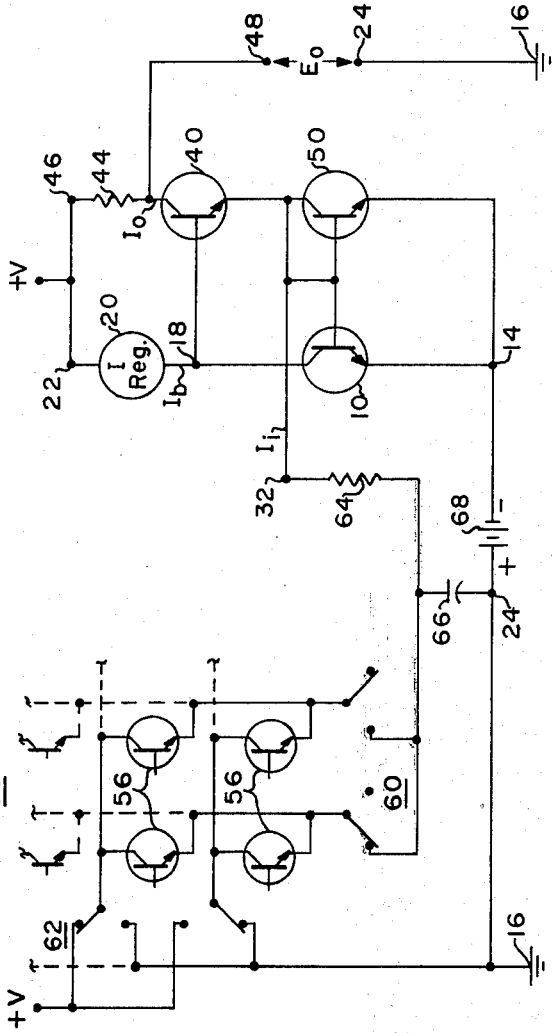
FIG. 2
FIG. 3
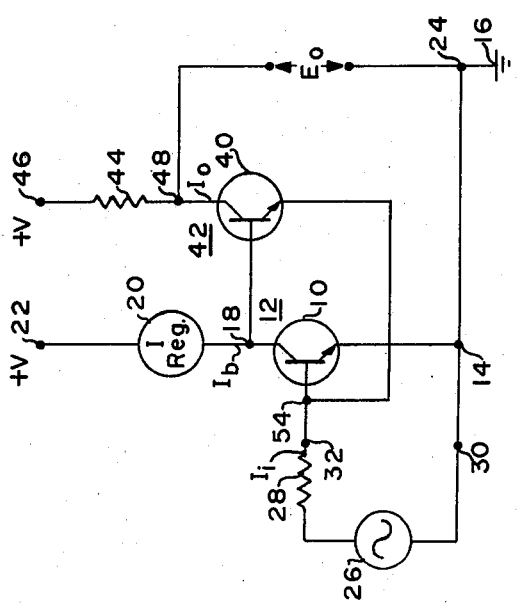
FIG. 1

SOLID-STATE CURRENT TRANSFORMER

ORIGIN OF THE INVENTION

The invention described herein was made in the performance of work under a NASA contract and is subject to the provisions of Section 305 of the National Aeronautics and Space Act of 1958, Public Law 85–568 (72 stat. 435; 42 U.S.C. 2457).

BACKGROUND OF THE INVENTION

1. Field of the Invention

This invention relates to an electronic circuit which functionally performs the same operation as a 1:1 (or unity turns ratio) current transformer; but, unlike its passive, mutually coupled inductive counterpart, does so unilaterally through essentially a one-to-infinity, input to output, impedance level conversion which prevents reverse interaction between its counterpoised ports.

2. General Description of the Prior Art

It may be simply stated that prior to this invention, no simple electronic network could be found that exhibited the combined properties of very low input impedance and very high transfer characteristic linearity when driven from a voltage source and quiescently biased in the low microampere current range. While such requirements at first glance appear to resemble the intrinsic features of an ordinary bi-polar transistor operated in the common base configuration, close scrutiny points out that a common base transistor stage possesses a linear transfer function only when driven by a current source (not a voltage source) since its input impedance varies widely as an inverse function of the emitter current.

It is the object of the present invention to provide with a simple circuit of few components what is best termed a solidstate current transformer exhibiting both a low input impedance and a linear transfer characteristic between input and output while operating at extremely low input levels.

SUMMARY OF THE INVENTION

In accordance with the invention, the collector output of a common emitter transistor amplifier stage is directly coupled to the base input of an emitter follower stage with the thus connected collector and base elements of these stages being biased from a constant current source. The emitter of the emitter follower stage is directly connected back to the base of the common emitter input stage with output from the network thus formed being secured at the collector terminal of the emitter follower stage.

BRIEF DESCRIPTION OF THE DRAWINGS

FIG. 1 is an electrical schematic diagram of a basic form of the invention.

FIG. 2 is an electrical schematic diagram of a preferred embodiment of the invention.

FIG. 3 is an electrical schematic diagram illustrating an application of the invention as the critical low level signal acquisition interface between the output of a phototransistor array and subsequent high level processing circuitry.

DESCRIPTION OF THE PREFERRED EMBODIMENT

Referring to FIGS. 1 and 2, illustrating the basic and preferred embodiment of the invention, respectively, transistor 10 is connected as a common emitter stage 12 with its emitter terminal 14 being connected to ground 16, and its collector terminal 18 is connected through constant current regulator 20 to the positive terminal 22 of a power supply, the negative terminal of which (not shown) is connected to ground, or reference point 24. As shown in FIG. 2, depending upon whether an inverting or noninverting output is desired, input source 26, with source resistance 28, is connected across terminals 30 and 32; or input source 34, with source resistance 36, is connected across terminals 30 and 38.

The collector output of transistor 10 is directly connected to the base input of transistor 40, which is connected as emitter follower stage 42 but has its collector connected through load resistor 44 to the positive terminal 46 of the power source. The output of the circuit, $E_o$, is available between terminals 48 and 24. The emitter output of transistor 40 is directly connected back to the base input 54 of transistor 10 to provide complete inverse feedback.

Referring particularly to FIG. 2, transistor 50 is connected as a bias equalization and stabilization diode, or diode stage 52 across the base emitter junction of transistor 10. The base and collector of transistor 50 are connected in common with base terminal 54 of transistor 10, and the emitter of transistor 50 is connected to emitter terminal 14 of transistor 10. Connected in this manner, transistor diode connected stage 52 serves to both minimize temperature-induced variations in the composite network perameters and to balance the effect which bias current $I_b$ and input current $I_i$ have on output current $I_o$, thus significantly reducing the level of bias current required to the point where it need be no greater than the peak positive value of the input current to prevent output stage 42 from being cut off. With this device in place, the interrelationship among the various node currents reduces to simple $I_o = I_b - I_i$; where $I_o$ is the output current from the circuit to load resistor 44, $I_b$ is the bias current into the circuit from constant current regulator 20, and $I_i$ is the input current to the circuit from signal source 26.

Functionally, transistors 10 and 40 act concordantly as a reference current source for which the level is controlled by, and is identical to, bias current $I_b$ supplied through constant current regulator 20. By comparing the combined value of input current $I_i$ and output current $I_o$ to the value of bias current $I_b$, any imbalance is quickly removed by an appropriate and inherent adjustment in the output, made by transistor 40. Linearity of the aggregate network's transfer characteristics with voltage as well as current sources is assured both by the fact that the input impedance of the circuit is so low as to be virtually nonexistent (typically less than 0.1 ohm) and by the fact that it is unaffected by either the amplitude or the polarity of the input signal so long as this signal does not result in any current which exceeds the value of the bias current. Consequently, even when the input signal does originate from a voltage source, an immediate and totally linear conversion to a current based signal occurs through the existing driving point source resistance which is typically in series with the input of the circuit. Hence, the circuit in effect "sees" a driving point current source regardless of whether one in reality is present or there is merely the idealized Thevenin converted equivalent of one.

Since it is entirely permissible to feed the network at either the base or collector nodes of input stage 12, it should be equally apparent that both of these input points can be driven simultaneously. One way of expediently using this capacity is to drive these dual input terminals from a matching set of dual output terminals on a different pair of transistors to thus achieve a differential to a single ended conversion. Further apparent applications for this invention include audio and video processing systems where a minimum of harmonic interaction is needed between signals of different fundamental frequencies when they are mixed. In general, this allows any number of parallel inputs to be fed to the input terminal of the circuit, which then provides an accurate output representation of the arithmetic sum of these inputs.

FIG. 3 illustrates the invention employed as one channel of a multiple input, signal summing circuit of a high performance solid-state television camera. As shown, the output of a particular phototransistor 56 of matrix 58 of transistors, typically having 200 by 200 (or greater) elements, is selected by one of column switches 60 and row switches 62. Inclusion of resistor 64 and capacitor 66 at the input of the circuit serves a dual filtering role. In particular, the combination of passive elements functions mainly to roll off the commutated video signal bandwidth; but it also helps to dampen the effects of feed-through switching spikes coupled onto the signal input line from column switches 60, which are typically FET devices. Primary cancellation of these spikes must be realized through coincidence selection and deactivation of adjacent channels, of course, since without such coincident switching the coupled-in transients could easily swamp out a low level input signal. With the provision of this filter, signal levels as low as one millivolt have been successfully commutated from a 400 by 500 phototransistor matrix at rates in excess of two megahertz. Bias source 68, connected between common ground 24 and the emitter 14 of transistors 10 and 50, provides a forward bias to these transistors relative to the ground reference.

The output at terminal 48 relative to common ground terminal 24 is typically fed to post processing circuitry consisting of a buffer amplifier, a high-speed sampler which picks off the output peak through a narrow tuned, phased window, and an analog multiplexer which serializes the resulting sequence of sampled signals onto a common line with a number of similarly acquired signals to form a composite scan-converted video output from a high pixel count solid-state camera.

From the foregoing, it is to be appreciated that the solid-state current transformer of this invention provides a significant development in circuitry configurations by virtue of its extraordinarily linear transfer characteristics, extremely low input impedance, and phenomenonly wide dynamic range extending from picoamperes to amperes. It is believed that this unique circuit easily qualifies as a new basic building block for analog circuit designs. Additionally, its utter simplicity, totally active nature, and excellent stability make it a natural for use in monolithic currents. It is therefore anticipated that the number and diversity of systems and subsystems incorporating it will be very substantial and that it will facilitate realizing certain functional operations not formerly practical.

What is claimed is:
1. A solid-state television camera circuit comprising a matrix of solid-state photosensitive elements are directly switched to provide an unamplified serial output at first and second output terminals;
   a common emitter transistor circuit including a transistor, the base and emitter of which comprise an amplifier input;
   a capacitor coupled across said terminals;
   a resistor connected between said first terminal and the base input of said common emitter transistor circuit, and said resistor comprising with said capacitor a signal filter means for rolling off commutated video signal bandwidth and dampening feed-through switching spikes;
   a diode connected transistor circuit, the base and collector of same being connected together to the base of said common emitter transistor circuit, and the emitter being connected to the emitter of said common emitter transistor circuit;
   a forward emitter biasing source connected between said second terminal, a common terminal, and emitters of said diode connected transistor circuit and common emitter transistor circuit;
   an emitter follower transistor circuit, the base input of which is directly connected to the collector of said common emitter transistor circuit, and the emitter of said emitter follower circuit being directly connected to the base of said common emitter transistor circuit;
   a biasing source;
   a load impedance and said reverse biasing source being connected in series between the collector of said emitter follower transistor circuit and said common terminal;
   constant current biasing means for providing, separate from said amplifier input of said common emitter transistor circuit, collector, reverse, bias to said common emitter transistor circuit and base, forward, bias to said emitter follower transistor circuit, said constant current biasing means being connected between said direct connection between the base input of said emitter follower transistor circuit and the collector of said common emitter transistor and said biasing source; and
   output coupling means for coupling a signal output from said load impedance.

* * * * *